US011393735B2

(12) United States Patent
Liu et al.

(10) Patent No.: US 11,393,735 B2
(45) Date of Patent: Jul. 19, 2022

(54) SEMICONDUCTOR DEVICE INCLUDING REINFORCED CORNER SUPPORTS

(71) Applicant: WESTERN DIGITAL TECHNOLOGIES, INC., San Jose, CA (US)

(72) Inventors: Yangming Liu, Shanghai (CN); Ning Ye, San Jose, CA (US); Chin-Tien Chiu, Taichung (TW)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 16/277,180

(22) Filed: Feb. 15, 2019

(65) Prior Publication Data

US 2020/0006184 A1   Jan. 2, 2020

(30) Foreign Application Priority Data

Jun. 28, 2018 (CN) .......................... 201810689789.4

(51) Int. Cl.
*H01L 23/32* (2006.01)
*H01L 23/00* (2006.01)
*H01L 25/065* (2006.01)
*H01L 25/00* (2006.01)

(52) U.S. Cl.
CPC ............ *H01L 23/32* (2013.01); *H01L 23/562* (2013.01); *H01L 25/0657* (2013.01); *H01L 25/50* (2013.01); *H01L 2225/0651* (2013.01); *H01L 2225/06506* (2013.01); *H01L 2225/06562* (2013.01); *H01L 2225/06586* (2013.01)

(58) Field of Classification Search
CPC ... H01L 23/32; H01L 23/562; H01L 25/0657; H01L 25/50; H01L 2225/06506; H01L 2225/0651; H01L 2225/06562; H01L 2225/06586
See application file for complete search history.

(56) References Cited

U.S. PATENT DOCUMENTS

| | | | |
|---|---|---|---|
| 7,759,793 | B2 | 7/2010 | Hayashi |
| 8,274,792 | B2 | 9/2012 | Softer |
| 8,304,290 | B2 | 11/2012 | Graf et al. |
| 2002/0100610 | A1 | 8/2002 | Yasuda et al. |
| 2006/0160347 | A1 | 7/2006 | Nakayama et al. |
| 2007/0069378 | A1 | 3/2007 | Park et al. |
| 2009/0289357 | A1 | 11/2009 | Fujimoto et al. |
| 2011/0151627 | A1* | 6/2011 | Graf ........................ H01L 24/81 |
| | | | 438/121 |

(Continued)

*Primary Examiner* — Timor Karimy
(74) *Attorney, Agent, or Firm* — Vierra Magen Marcus LLP

(57) ABSTRACT

A semiconductor device is disclosed having reinforced supports at corners of the device. The semiconductor device may include solder balls on a lower surface of the device for soldering the device onto a printed circuit board. In one example, the solder balls at the corners of the semiconductor device may be replaced by support billets having more mass and more contact area between the semiconductor device and the PCB. In a further example, screws may be provided at the corners of the device (instead of the corner solder balls or in addition to the corner solder balls). These screws may be placed through the corners of the semiconductor device and into the printed circuit board.

14 Claims, 9 Drawing Sheets

(56) References Cited

U.S. PATENT DOCUMENTS

2012/0280374 A1* 11/2012 Choi .................. H01L 24/83
257/659
2013/0147052 A1* 6/2013 Zhang .................. H01L 24/05
257/774

* cited by examiner

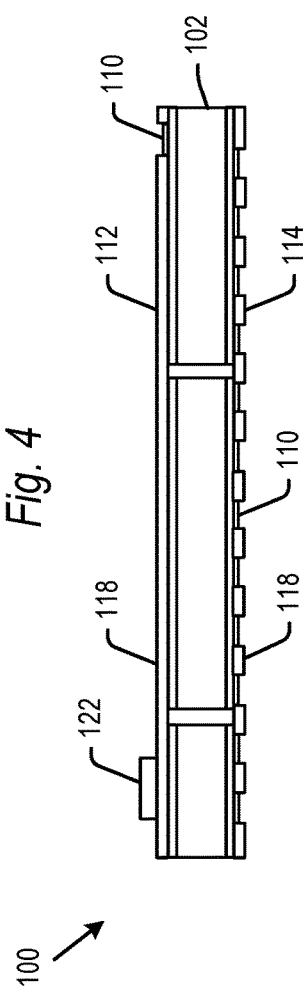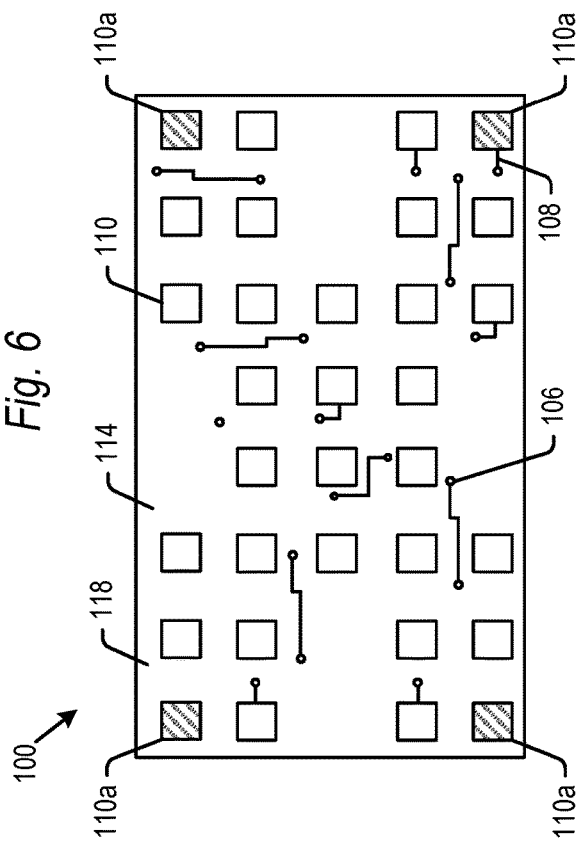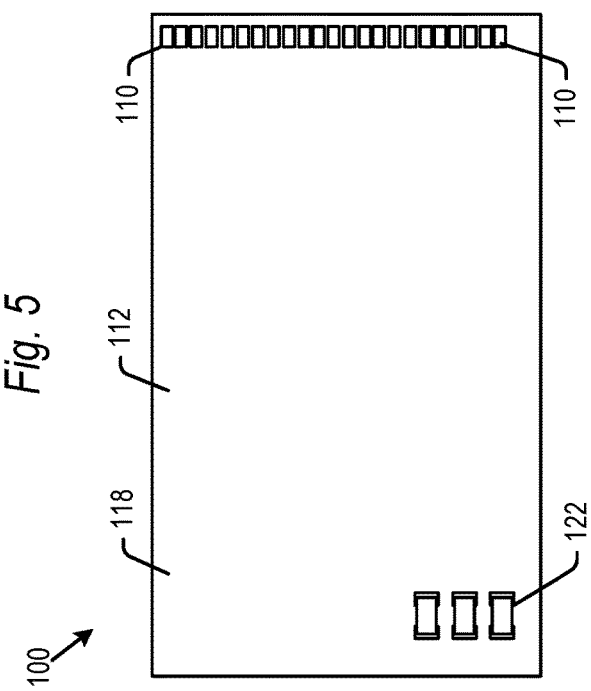

(Line 11-11)

SEMICONDUCTOR DEVICE INCLUDING REINFORCED CORNER SUPPORTS

BACKGROUND

The strong growth in demand for portable consumer electronics is driving the need for high-capacity storage devices. Non-volatile semiconductor memory devices, such as flash memory storage cards, are becoming widely used to meet the ever-growing demands on digital information storage and exchange. Their portability, versatility and rugged design, along with their high reliability and large capacity, have made such memory devices ideal for use in a wide variety of electronic devices, including for example digital cameras, digital music players, video game consoles, PDAs and cellular telephones.

While many varied packaging configurations are known, flash memory semiconductor devices may in general be fabricated as system-in-a-package (SIP) or multichip modules (MCM), where a plurality of semiconductor die are mounted and interconnected to an upper surface of a small footprint substrate. The substrate may in general include a rigid, dielectric base having a conductive layer etched on one or both sides. Solder balls are often mounted on contact pads formed on a lower surface of the substrate to allow the substrate to be soldered to a host device such as a printed circuit board. Once mounted, signals may be transferred between the semiconductor die and the host device via the substrate.

In conventional board level semiconductor product, mechanical stresses are often generated at the solder ball junction between substrate pad and PCB (printed circuit board) pad. For example, these stresses can be generated as a result of different coefficients of thermal expansion of the semiconductor package and PCB, for example during thermal cycling tests of the board level semiconductor product. These stresses can also be generated as a result of impact shock to the solder balls, for example during handling or drop testing of the semiconductor device. Such stresses tend to be higher at the corner solder ball bonds, and can result in board level reliability (BLR) failure at these corner bonds.

DESCRIPTION OF THE DRAWINGS

FIG. 4 is a side view of a substrate of a semiconductor device at a second step in the fabrication process according to an embodiment of the present technology.

FIG. 5 is a top view of the substrate of FIG. 4.

FIG. 6 is a bottom view of the substrate of FIG. 4.

DETAILED DESCRIPTION

The present technology will now be described with reference to the figures, which in embodiments, relate to a semiconductor device having reinforced supports at corners of the device. The semiconductor device may include solder balls on a lower surface of the device for soldering the device onto a PCB (printed circuit board). In one example, the solder balls at the corners of the semiconductor device may be replaced by support billets having more mass and more contact area between the semiconductor device and the PCB. In a further example, screws may be provided at the corners of the device (instead of the corner solder balls or in addition to the corner solder balls). These screws may be placed through the corners of the semiconductor device and into the PCB.

It is understood that the present technology may be embodied in many different forms and should not be construed as being limited to the embodiments set forth herein. Rather, these embodiments are provided so that this disclosure will be thorough and complete and will fully convey the technology to those skilled in the art. Indeed, the technology is intended to cover alternatives, modifications and equivalents of these embodiments, which are included within the scope and spirit of the technology as defined by the appended claims. Furthermore, in the following detailed description of the present technology, numerous specific details are set forth in order to provide a thorough understanding of the present technology. However, it will be clear to those of ordinary skill in the art that the present technology may be practiced without such specific details.

The terms "top" and "bottom," "upper" and "lower" and "vertical" and "horizontal" as may be used herein are by way of example and illustrative purposes only, and are not meant to limit the description of the technology inasmuch as the referenced item can be exchanged in position and orientation. Also, as used herein, the terms "substantially," "approximately" and/or "about" mean that the specified dimension or parameter may be varied within an acceptable manufacturing tolerance for a given application. In one embodiment, the acceptable manufacturing tolerance is ±0.25% of a given dimension.

Figure 1:
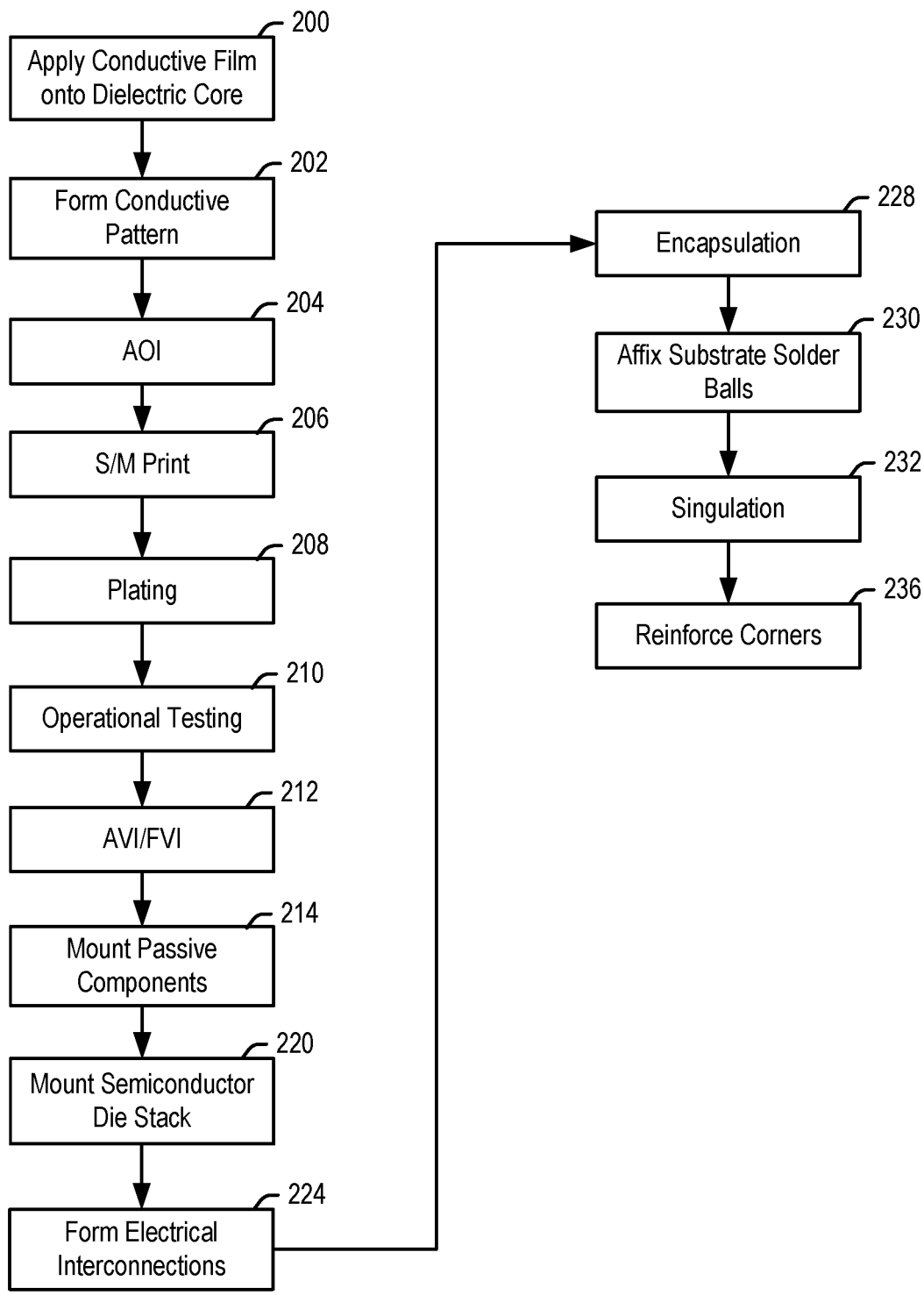
FIG. 1 is a flowchart of the overall fabrication process of a substrate and a semiconductor device using that substrate according to embodiments of the present technology.

An embodiment of the present technology will now be explained with reference to the flowchart of FIG. 1 and the top, side and perspective views of FIGS. 2 through 18. Although the figures show an individual semiconductor device 150, or a portion thereof, it is understood that the device 150 may be batch processed along with a plurality of other semiconductor devices on substrate panels to achieve economies of scale. The number of rows and columns of devices 150 on the substrate panels may vary.

Figure 2:
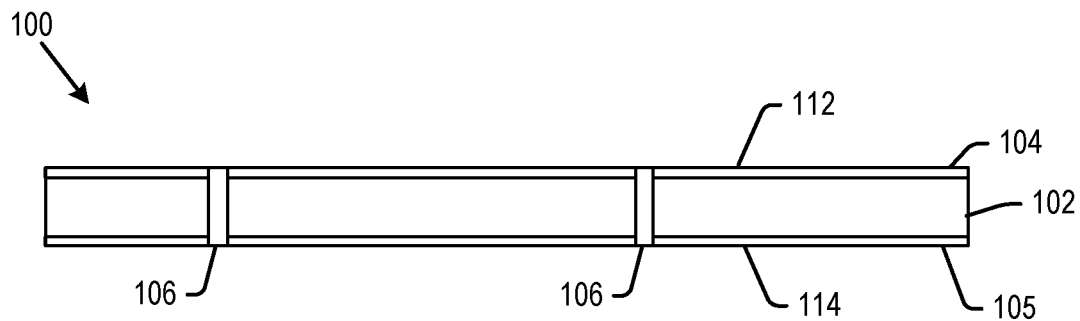
FIG. 2 is a side view of a substrate of a semiconductor device at a first step in the fabrication process according to an embodiment of the present technology.

The substrate panel for the fabrication of semiconductor device 150 begins with a plurality of substrates 100 (again, one such substrate is shown in FIGS. 2-6). The substrate 100 may be a variety of different chip carrier mediums, including a printed circuit board (PCB), a leadframe or a tape automated bonded (TAB) tape. Where substrate 100 is a PCB, the substrate may be formed of a core 102 as shown in FIG. 2. The core 102 may be formed of various dielectric materials such as for example, polyimide laminates, epoxy resins including FR4 and FR5, bismaleimide triazine (BT), and the like. The core may have a thickness of between 40 microns (μm) to 200 although the thickness of the core may vary outside of that range in alternative embodiments. The core 102 may be ceramic or organic in alternative embodiments.

Figure 3:
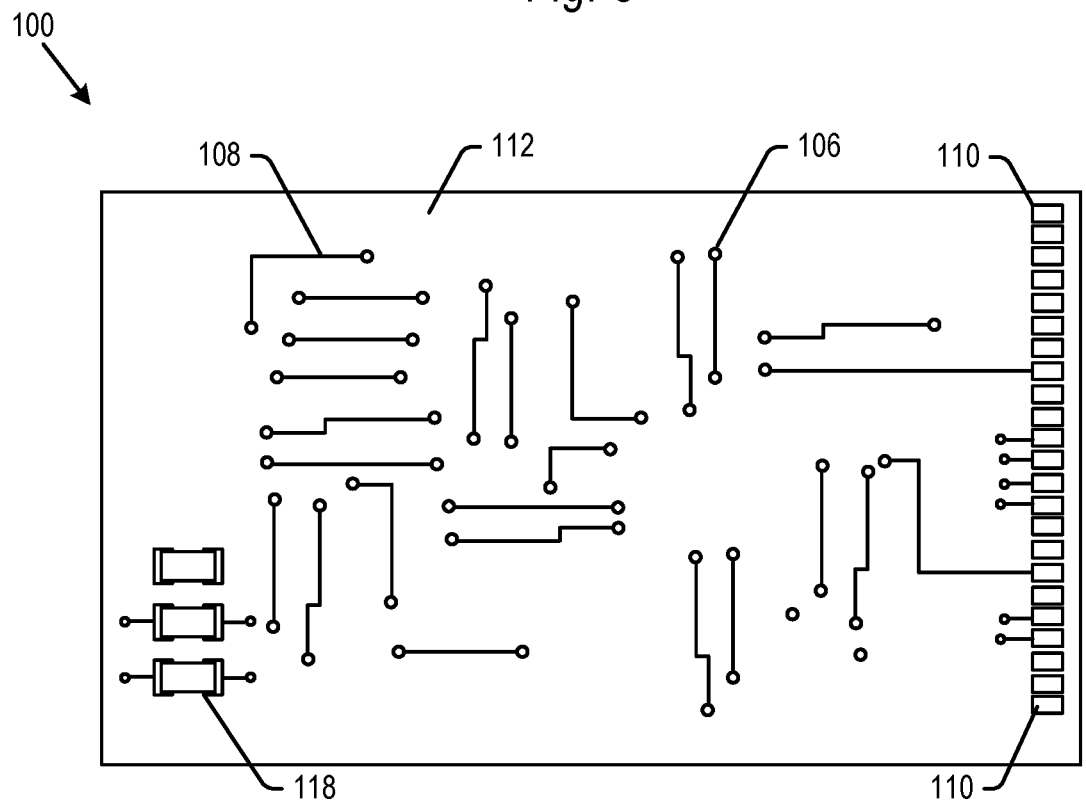
FIG. 3 is a top view of the substrate of FIG. 2.

In step 200, conductive layers 104 and 105 may be formed on the exposed planar surfaces of the dielectric core 102, as shown in the edge and top views of FIGS. 2 and 3, respectively. The conductive layers 104, 105 may be formed of copper or copper alloys, plated copper or plated copper alloys, Alloy 42 (42Fe/58Ni), copper plated steel, or other metals and materials suitable for use on substrate panels. The conductive layers 104, 105 may have a thickness of about 8 μm to 40 although the thickness of the layers may vary outside of that range in alternative embodiments.

In a step 202, a conductive pattern of vias, leads and/or pads are formed in and through the substrate 100. The substrate 100 may drilled to define through-hole vias 106, which are subsequently plated and/or filled with a conductive metal. A conductance pattern of electrical traces 108 and contact pads 110 may then be formed on the top and/or bottom major planar surfaces of substrate 100. FIG. 3 shows an example of a conductance pattern including traces 108 and contact pads 110 formed on a first major planar surface 112 of substrate 100. FIG. 6 shows an example of a conductance pattern including traces 108 and contact pads 110 formed on a second major planar surface 114 of substrate 100.

The pattern of vias, 106, traces 108 and contact pads 110 shown on surfaces 112 and 114 in the figures are by way of example, and the substrate 100 may include more or less vias, traces and/or contact pads in further embodiments, and they may be in different locations in further embodiments. The conductance pattern on the top and/or bottom surfaces of the substrate 100 may be formed by a variety of known processes, including for example various photolithographic processes.

In accordance with aspects of the present technology, support billets may be provided at one or more contact pads 110a at each of the corners of the substrate 100 as explained below. The contact pads 110a that receive the support billets may be identical to the other contact pads 110. However, in further embodiments, the contact pads 110a may be thicker, larger and/or made of a more rigid material than the other contact pads 110. In embodiments, contact pads 110a are provided for structural support and are not used for signal transmission. In such embodiments, the contact pads 110a need not have traces 108 connected thereto. However, in further embodiments, the contact pads 110a may be used for signal communication.

Referring again to FIG. 1, the substrate 100 may next be inspected in step 204. This step may include an automatic optical inspection (AOI). Once inspected, a solder mask 118 may be applied to the upper and/or lower surfaces of the substrate in step 206, as shown in the edge, top and bottom views of FIGS. 4, 5 and 6, respectively. After the solder mask is applied, the contact pads 110, and any other areas to be soldered on the conductance patterns may be plated, for example, with a Ni/Au, Alloy 42, or the like, in step 208 in a known electroplating or thin film deposition process. The substrate 100 may next undergo operational testing in step 210 to ensure the substrate 100 is working properly. In step 212, the substrate may be visually inspected, including for example an automated visual inspection (AVI) and a final visual inspection (FVI) to check for contamination, scratches and discoloration. One or more of these steps may be omitted or performed in a different order in further embodiments.

Assuming the substrate 100 passes inspection, passive components 122 (FIGS. 4 and 5) may next be affixed to the substrate 100 in a step 214. The one or more passive components may include for example one or more capacitors, resistors and/or inductors, though other components are contemplated. The passive components 122 shown are by way of example only, and the number, type and position may vary in further embodiments.

The above-described substrate 100 may have a thickness ranging between 0.05 mm and 0.3 mm, and more particularly 0.08 mm or 0.21 mm. It is understood that the substrate 100 may have other thicknesses in further embodiments. In embodiments described above, the substrate 100 is a two layer substrate (two conductive layers sandwiched on a dielectric layer). In further embodiments, the substrate 100 may include more layers, such as for example a four layer substrate (four conductive layers interspersed around three dielectric layers).

Figure 7:
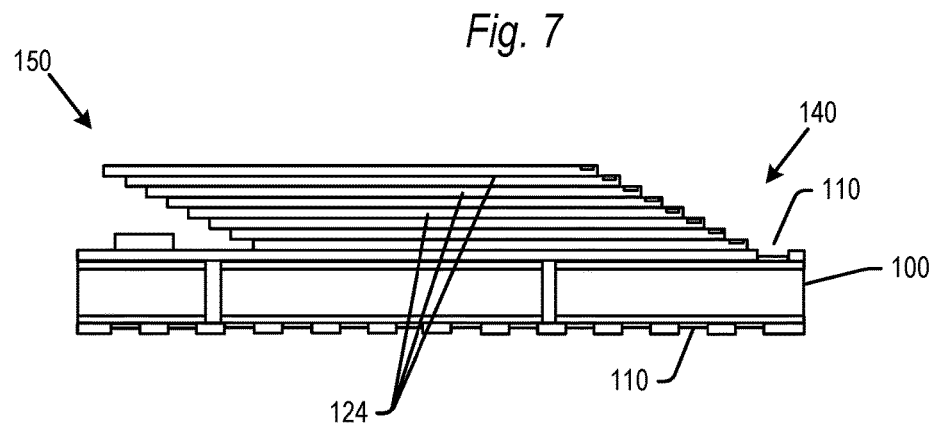
FIG. 7 is a side view of a number of semiconductor die mounted on a substrate according to embodiments of the present technology.

In step 220, one or more semiconductor die 124 may be mounted on the substrate 100, as shown in the edge view of FIG. 7. The semiconductor die 124 may for example be memory die such as 2D NAND flash memory or 3D BiCS (Bit Cost Scaling), V-NAND or other 3D flash memory, but other types of die 124 may be used. These other types of semiconductor die include but are not limited to controller die such as an ASIC, or RAM such as an SDRAM, DDR SDRAM, LPDDR and GDDR.

Where multiple semiconductor die 124 are included, the semiconductor die 124 may be stacked atop each other in a variety of configurations. In one example, the die are stacked in an offset stepped configuration to form a die stack as shown for example in FIG. 7. The die may alternatively be stacked directly on top of each other, using for example spacers between each die to leave room for the electrical interconnections (explained below). The number of die 124 shown in the stack is by way of example only, and embodiments may include different numbers of semiconductor die, including for example 1, 2, 4, 8, 16, 32 or 64 die. There may be other numbers of die in further embodiments. The die may be affixed to the substrate and/or each other using a die attach film. As one example, the die attach film may be cured to a B-stage to preliminarily affix the die 124 in the stack, and subsequently cured to a final C-stage to permanently affix the die 124 to the substrate 100.

Figure 8:
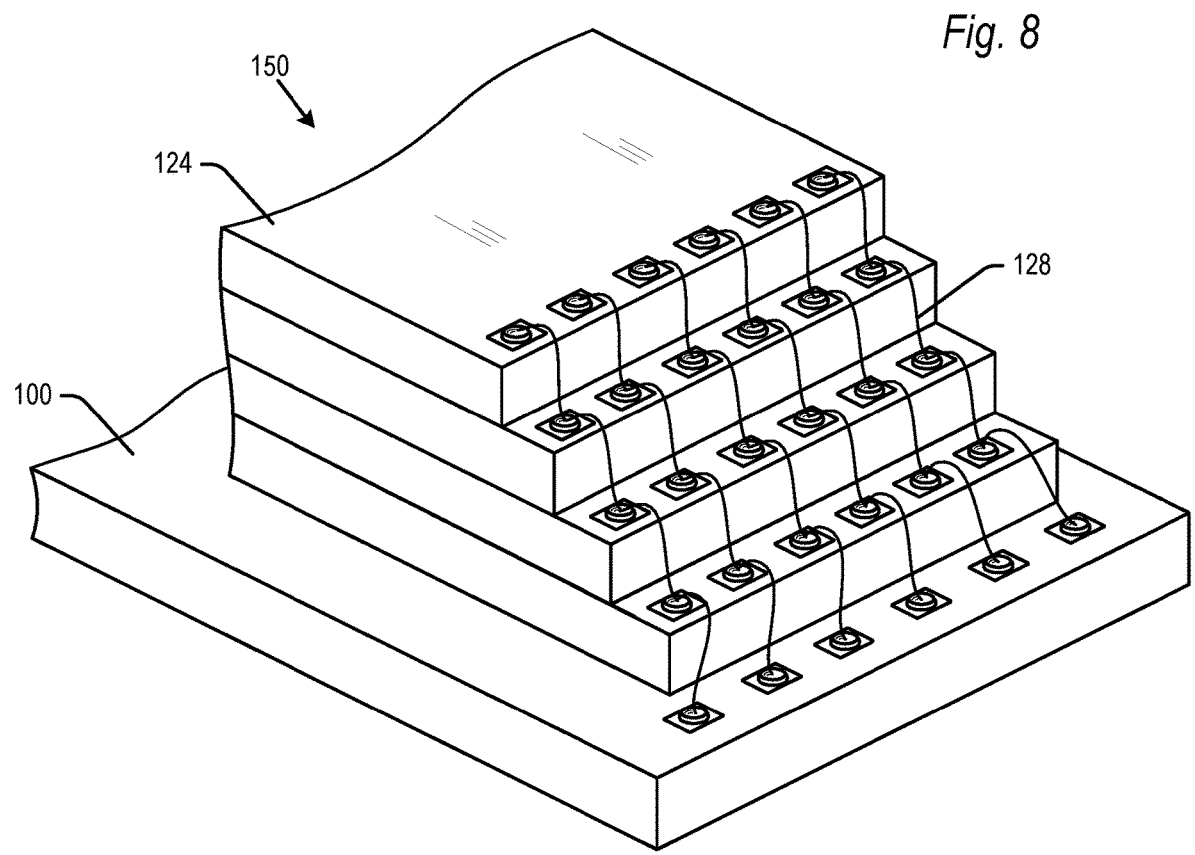
FIG. 8 is a perspective view of a number of semiconductor die mounted on, and wire bonded to, a substrate according to embodiments of the present technology.

In step 224, the semiconductor die 124 may be electrically interconnected to each other and to the substrate 100. FIG. 8 shows a perspective view of wire bonds 128 being formed between corresponding die bond pads on respective die 124 down the stack, and then bonded to contact pads 110 on surface 112 of substrate 100. The wire bonds may be formed by a ball-bonding technique, but other wire bonding techniques are possible. The semiconductor die 124 may be electrically interconnected to each other and the substrate 100 by other methods in further embodiments, including by through-silicon vias (TSVs).

Figure 9:
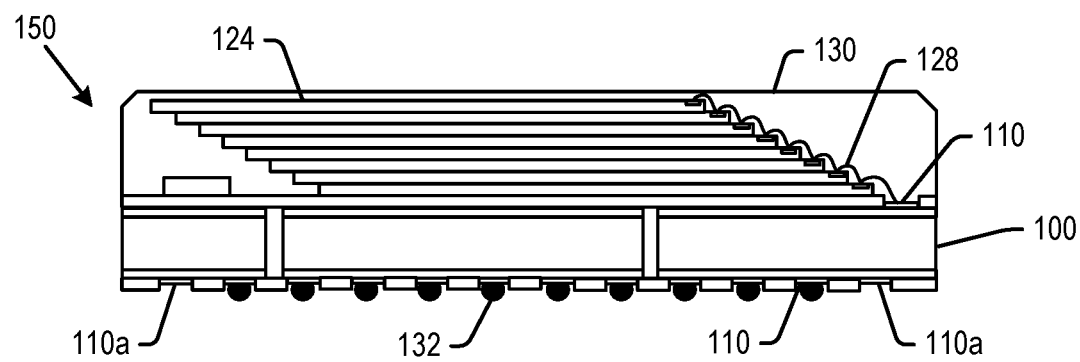
FIG. 9 is a side view of a semiconductor device according to embodiments of the present technology.

Following electrical connection of the die 124 to the substrate 100, the semiconductor device 150 may be encapsulated in a mold compound 130 in a step 228 and as shown in FIG. 9. Mold compound 130 may include for example solid epoxy resin, Phenol resin, fused silica, crystalline silica, carbon black and/or metal hydroxide. Other mold compounds from other manufacturers are contemplated. The mold compound may be applied by various known processes, including by compression molding, FFT (flow free thin) molding, transfer molding or injection molding techniques.

Figure 11:
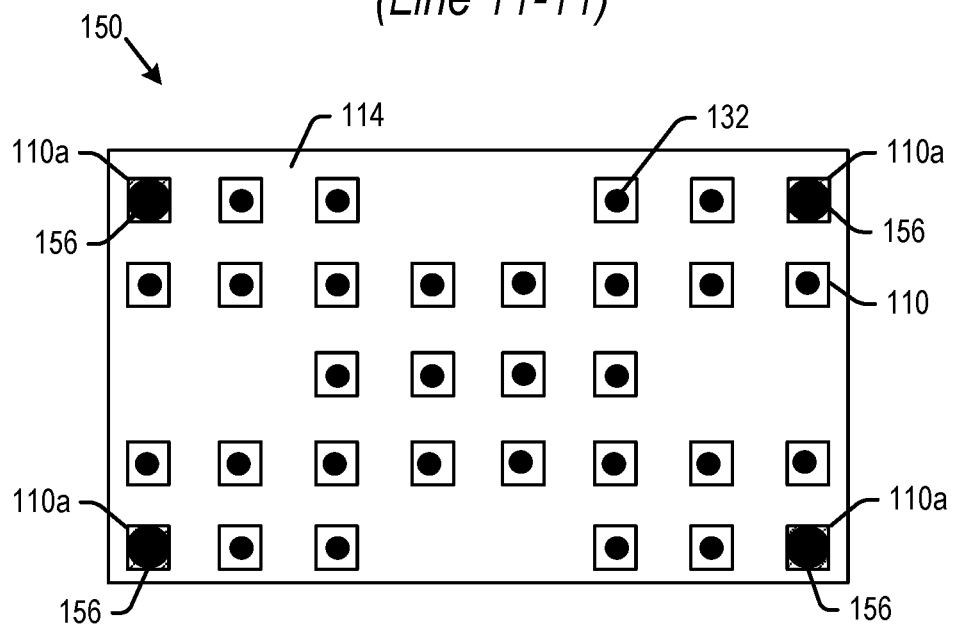
FIG. 11 is a cross-sectional bottom view through line 11-11 of FIG. 10.
Figure 12:
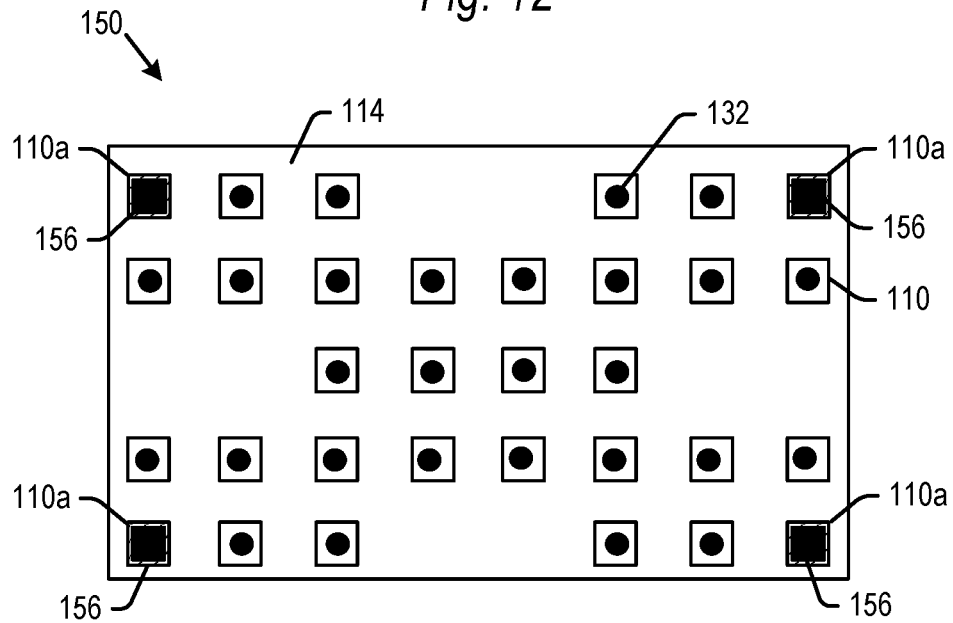
FIGS. 12-14 are cross-sectional bottom views through line 11-11 of FIG. 10 according to alternative embodiments of the present technology.

In step 230, solder balls 132 may be affixed to the contact pads 110 on a lower surface 114 of substrate 100 as shown in FIGS. 11 and 12. The solder balls 132 may be used to solder the semiconductor device to a host device, such as a printed circuit board. The pattern of contact pads 110 and solder balls 132 shown on the bottom surface 114 of substrate 100 in FIG. 12 is by way of example only, and may vary in further embodiments. In embodiments, the number of solder balls 132 may range from between 50 and 1000, and more particularly 70 to 500.

As noted in the Background section, mechanical stresses develop between the semiconductor device and the host device (e.g., PCB) to which the semiconductor device is attached, particularly at corners of the semiconductor device. In accordance with aspects of the present technology, corners of the semiconductor device 150 may be affixed to the host device using high strength affixation structures.

Figure 10:
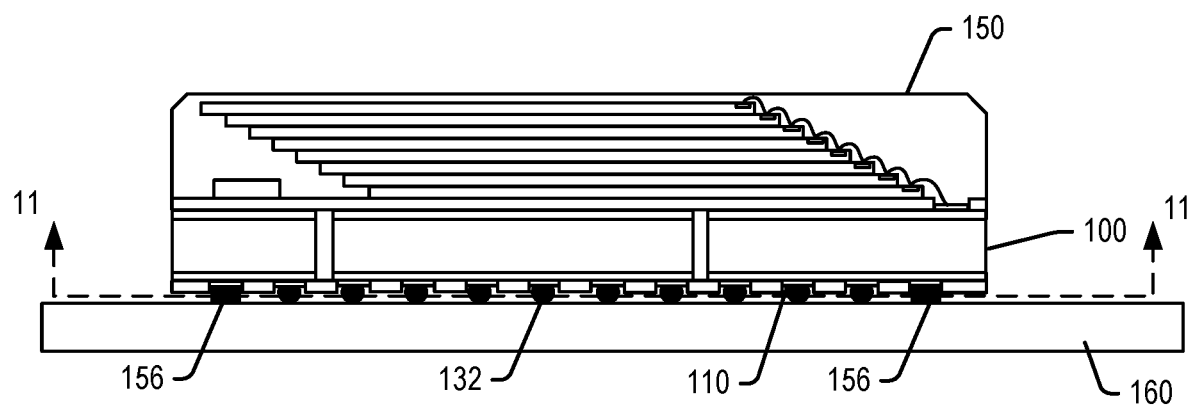
FIG. 10 is a side view of a completed semiconductor device mounted on a host device.

In one embodiment, solder balls 132 may be omitted from the corner bond pads 110a, as shown for example in FIG. 9. In place of solder balls 132, the corner bond pads 110 may receive support billets 156 to reinforce the corners in step 236. FIG. 10 shows an edge view of a semiconductor device 150 mounted to a host device 160, which may for example be a PCB. As seen in FIG. 10 and the cross-sectional view through line 11-11 in FIG. 11, the support billets 156 are larger and/or stronger than the solder balls 132 and provide greater support at the corners of the semiconductor device 150. In embodiments, the support billets 156 may be formed of copper, but may be formed of other materials having higher tensile and/or shear strength than the solder balls 132.

Figure 13:
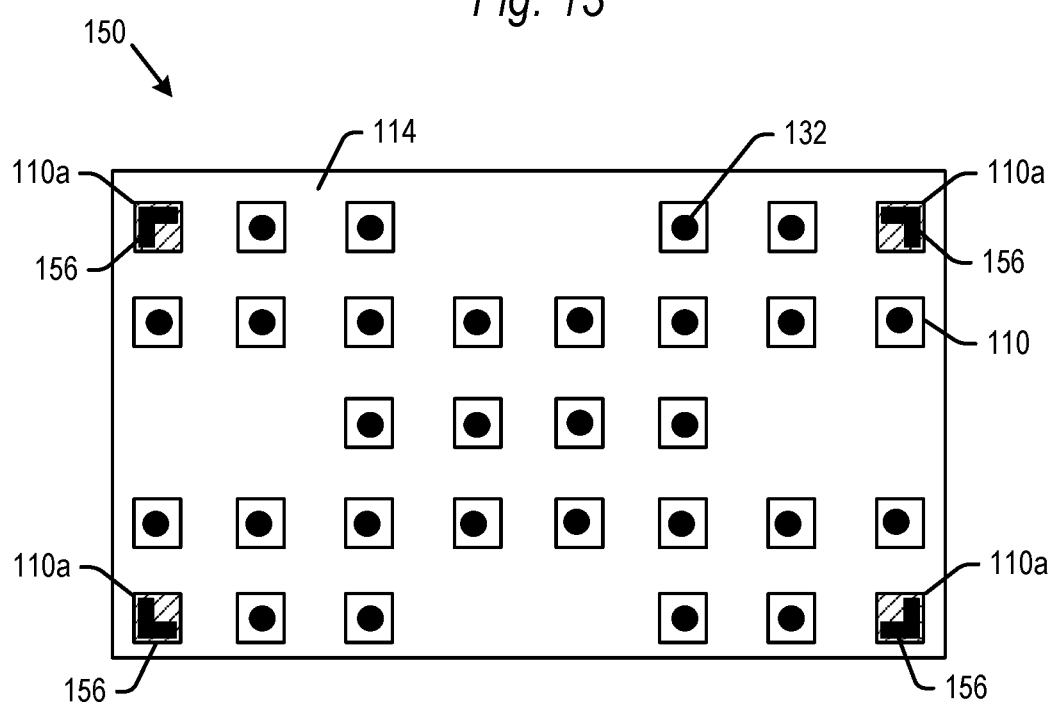

As shown in the cross-sectional view of FIG. 10, in embodiments, the billets may have a circular cross-section to provide cylindrical billets 156. However, the support billets may have other shapes in further embodiments. FIG. 12 shows an example where the support billets 156 have a square (or rectangular) cross-section. FIG. 13 shows an example where the support billets 156 have an "L"-shaped cross-section.

As noted, the support billets may be formed of a material, such as copper, having a higher tensile and/or shear strength than the solder used for solder balls 132. In embodiments, the support billets may additionally and/or alternatively be larger than the solder balls 132. The contact pads 110a receiving the support billets may be between 70 μm and 150 μm square. Where the support billets 156 are cylindrical, the support billets 156 may have a diameter which takes up all or substantially all of the length or width of the contact pads 110a, such as for example a diameter of 40 μm to 150 μm. The contact pads 110a may be smaller or larger than that in further embodiments, with the support billets 156 taking up, for example, 50% to 100% of the length or width of the contact pads 110a.

In embodiments, billets 156 are provided for structural support and are not used for signal transmission. In such embodiments, the contact pads 110a to which billets 156 are affixed need not have traces 108 connected thereto. However, in further embodiments, the billets 156 and contact pads 110a may be used for signal communication.

As noted, given the material and/or size of the support billets 156, the support billets 156 provide greater tensile strength than the solder balls 132. In one example, each support billet may have a tensile strength of between 200-300 MPa, as compared to the tensile strength of a solder ball, which is about 20-100 MPa. The tensile strength of the support billets may be higher or lower than that in further embodiments. There is similarly a linear correlation between shear strength and tensile strength so that the support billets 156 have a higher shear strength than the solder balls 132.

Figure 14:
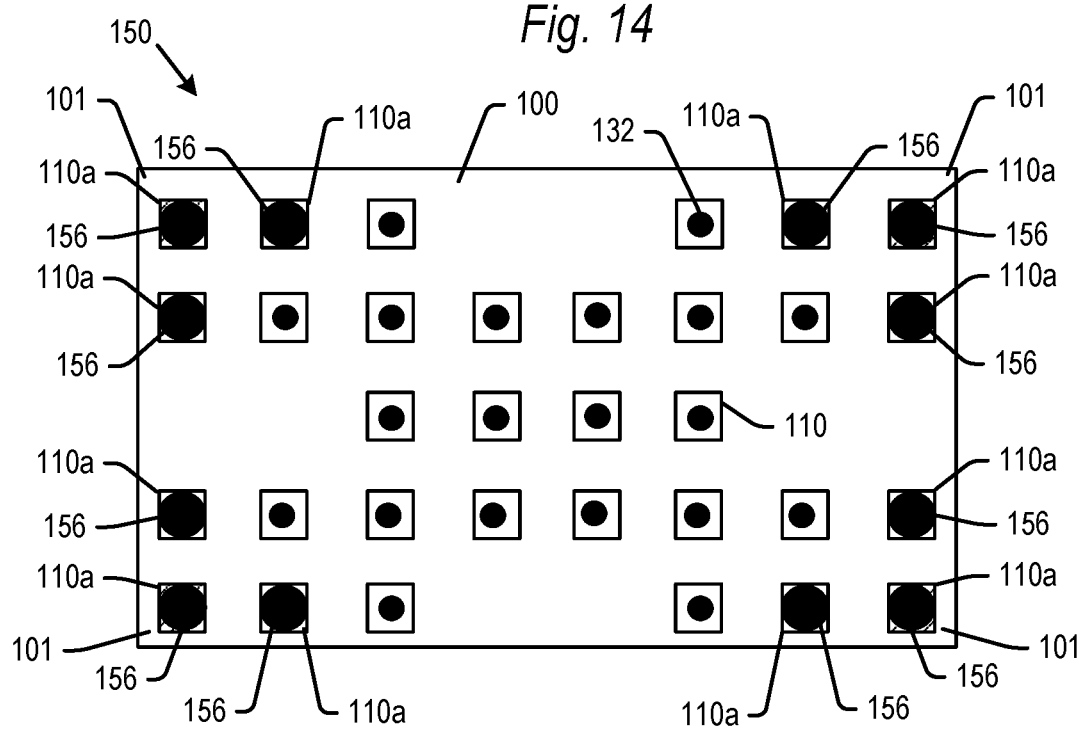
Figure 15:
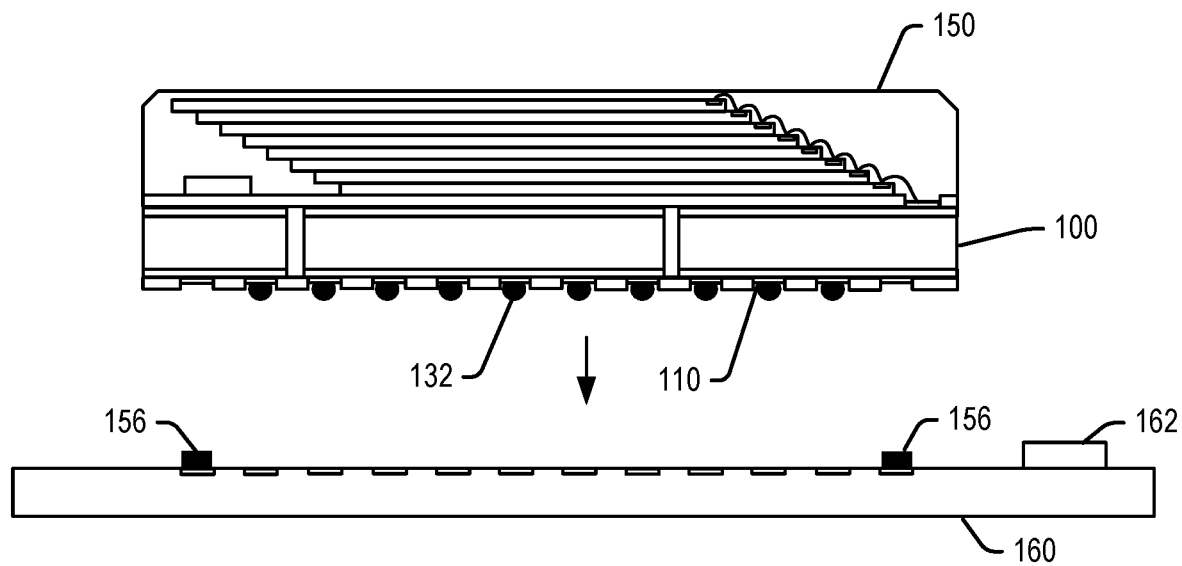
FIGS. 15 and 16 are cross-sectional views of a semiconductor device being mounted on a host device according to alternative embodiments of the present technology.
Figure 16:
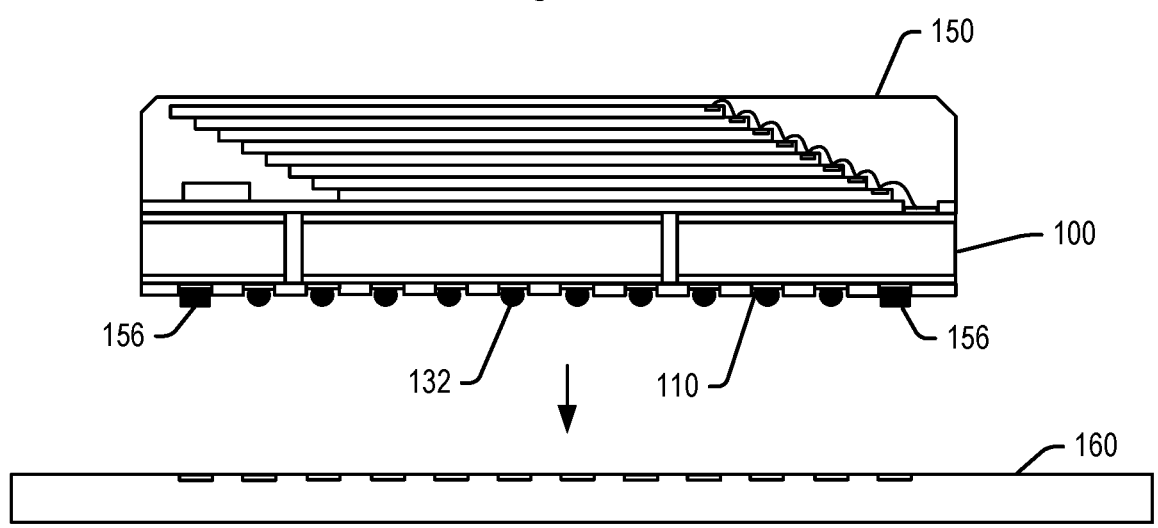

Given the increased mechanical stresses at the corners of the semiconductor device 150, the support billets 156 may be positioned at the contact pads 110a at the four corners. However, in further embodiments, support billets 156 may replace solder balls 132 at more than just the extreme four corners of the semiconductor device 150. FIG. 14 shows a further embodiments where support billets are provided at more than one contact pad at each of the corners 101 of substrate 100. In the embodiment of FIG. 14, three contact pads 110a in each corner 101 each include support billets 156. There may be two, or more than three contact pads 110a in each corner having support billets 156 in further embodiments.

In embodiments, the support billets may initially be mounted on contact pads on the host device 160, and then coupled to bond pads 110a (left uncovered by solder mask 118) when the semiconductor device 150 is mounted on the host device 160. Such an embodiment is shown in the edge view of FIG. 15. The support billets 156 may be mounted on the contact pads of the host device 160 in a same process in which other electronic components 162 (such as passive devices) are mounted on the host device 160. However, in alternative embodiments, the support billets 156 may initially be mounted on the contact pads 110a, and after that, the semiconductor device 150 including the support billets 156 may be mounted on the host device 160. Such an embodiment is shown in the edge view of FIG. 16.

As noted above, the semiconductor device 150 may be formed on a panel of substrates. In embodiments where the support billets are initially affixed to the host device 160, the semiconductor devices 150 may be singulated from each other after encapsulation and affixation of the solder balls 132. Thereafter, the semiconductor devices may be affixed to the host device 160 and support billets 156. In embodiments where the support billets are initially affixed to the semiconductor device 150, the semiconductor devices 150 may be singulated from each other after encapsulation and affixation of the solder balls 132 and support billets 156. Thereafter, the semiconductor devices may be affixed to the host device.

The semiconductor devices 150 may be singulated by any of a variety of cutting methods including sawing, water jet cutting, laser cutting, water guided laser cutting, dry media cutting, and diamond coating wire cutting. While straight line cuts will define generally rectangular or square shaped semiconductor devices 150, it is understood that semiconductor device 150 may have shapes other than rectangular and square in further embodiments of the present technology.

Figure 17:
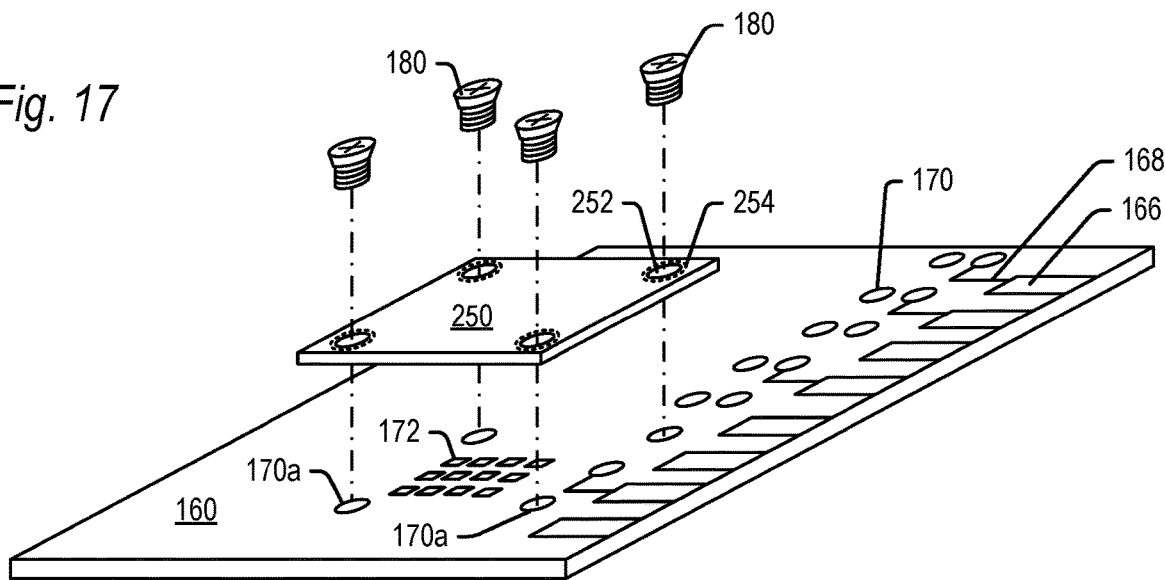
FIGS. 17 and 18 are perspective views where the corner support structures comprise screws for affixing a semiconductor device to a host device.
Figure 18:
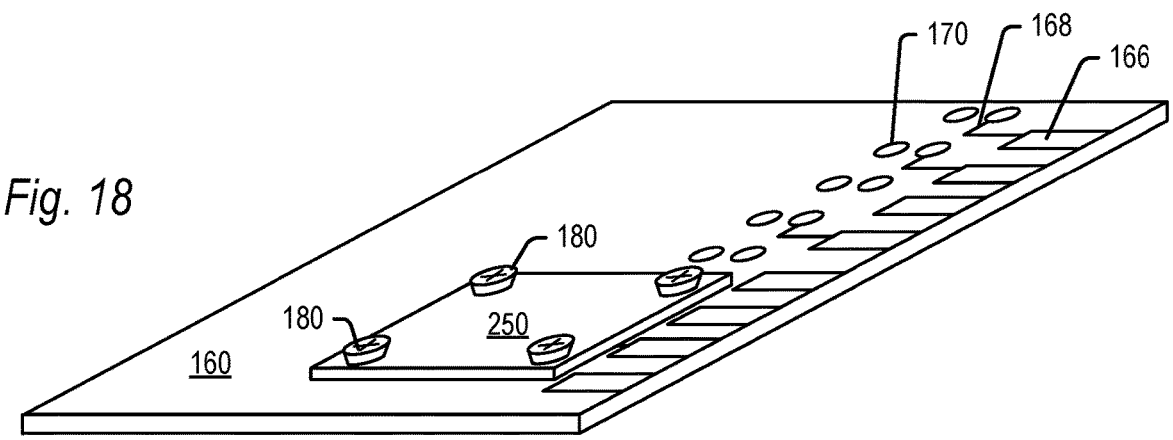

In embodiments described above, support billets are provided at the corners of the semiconductor device 150 to provide additional structural support and to facilitate secure affixation to the host device 160. Structural supports other than support billets may be used in further embodiments. FIGS. 17 and 18 show one such alternative embodiment where screws are used as structural supports at the corners of the semiconductor device 150.

FIG. 17 is an exploded perspective view of a host device 160, and a semiconductor device 250 to be attached to the host device 160. In the embodiment shown, the host device 160 may be a PCB including electrical connectors 166 which fit within an edge connector (not shown) on a mother board or other PCB. The host device 160 may be other PCBs or electronic devices in further embodiments. One or more of the electrical connectors 166 may be coupled by traces 168 to plated through-holes 170 which help route electrical signals through the host device 160.

Semiconductor device 250 may be similar to semiconductor device 150, except that the contact pads 110*a* and support billets 156 may be omitted. Additionally, screw holes 252 are formed at corners of the semiconductor device 250, through the mold compound 130 and substrate 100. While four such screw holes 252 are shown, they may be more or less than four screw holes in further embodiments.

One further difference between semiconductor device 250 and semiconductor device 150 is that keep out areas 254 (shown in phantom) may be formed in the portions of the substrate 100 and semiconductor device 250 in the area around screw holes 252. That is, when forming the conductive pattern on substrate 100 in step 202 (FIG. 1), no vias 106, traces 108 or contact pads 110 may be formed in the keep out areas 254 of the semiconductor device 250. Alternatively, the keep out areas 254 may include one or more vias, traces and/or contact pads, but those vias, traces and/or contact pads are not used in signal communication between the host device 160 in the semiconductor device 250.

In embodiments, screw holes 252 are formed through the mold compound 130 (FIG. 9), but do not contact semiconductor die 124 within the semiconductor device 150. In particular, the substrate 100 and mold compound 130 may be larger than a footprint of the stack of semiconductor die 124 so that the screw holes 152 may be formed at the corners of the semiconductor device 250 while being spaced from the semiconductor die 124 within the semiconductor device 250.

The plated through-holes 170 on the host device 160 may include threaded through-holes 170*a*, which may be threaded to receive screws 180. In embodiments, the threaded through-holes 170*a* are not used for signal communication.

As shown in the assembled perspective view of FIG. 18, the screws 180 may fit through screw holes 252 in semiconductor device 250, and be screwed into the threaded through-holes 170*a* on the host device 160 to secure the semiconductor device 250 to the host device 160. It is noted that screws 180 may be used in addition to solder balls 132 which are coupled to contact pads 172 on the host device 160.

Although shown as extending above a surface of the semiconductor device 250, the heads of the screws 180 may be countersunk so as to be flush with the surface of the semiconductor device 250. The screws 180 may be microscrews or the like formed from copper, aluminum, steel or other materials. The screws 180 have a higher modulus than the solder balls 132. The screws 180 may be provided instead of the corner solder balls 132, or in addition to the corner solder balls 132.

The use of support billets and/or screws adds structural support for semiconductor devices 150 and 250, and serve to dissipate stresses that otherwise may develop at corners of the semiconductor devices 150 and 250. Thus, board level reliability (BLR) performance is improved as the additional structural supports prevent the solder balls from cracking or detaching. The support billets and/or screws also provide advantages in that an under-fill layer, traditionally used to connect a semiconductor device to a host device, may be omitted. Omission of the under-fill layer alleviates the need to inject an epoxy beneath the semiconductor device 150, 250, omits the need to cure such a layer, and omits the need to clean the semiconductor device 150, 250 and/or the host device after the under-fill layer is applied. Furthermore, provision of the structural billets and/or screws provides a better pathway for thermal dissipation from the semiconductor devices 150 and 250.

In summary, in one example, the present technology relates to a semiconductor device, comprising: a substrate, the substrate comprising: solder balls configured to couple the semiconductor device to a host device, and corner structural supports at corners of the substrate, the corner structural supports having a higher strength than the solder balls; and one or more semiconductor die coupled to the substrate.

In another example, the present technology relates to a semiconductor device, comprising: a substrate, the substrate comprising: solder balls configured to couple the semiconductor device to a host device, and one or more structural billets at each of the corners of the substrate, the one or more structural billets having a higher strength than the solder balls; and one or more semiconductor die coupled to the substrate.

In another example, the present technology relates to a host device for receiving a semiconductor device, the host device comprising: a pattern of contact pads configured to receive a plurality of solder balls on a group of contact pads on the semiconductor device; and structural billets at corners of the pattern of contact pads on the host device, the structural billets configured to mate with corner contact pads of the group of contact pads on the semiconductor device.

In a further example, the present technology relates to a semiconductor device, comprising: a substrate; one or more semiconductor die coupled to the substrate; and molding compound around the one or more semiconductor die; wherein screw holes are formed at corners of the semiconductor device, through the substrate and molding compound, the screw holes configured to receive screws for screwing the semiconductor device down onto a host device.

In another example, the present technology relates to a semiconductor device, comprising: a substrate, the substrate comprising: solder balls configured to couple the semiconductor device to a host device, and structural support means for structurally supporting the semiconductor device on a host device, the structural support means provided at corners of the substrate and having a higher strength than the solder balls; and one or more semiconductor die coupled to the substrate.

The foregoing detailed description of the technology has been presented for purposes of illustration and description. It is not intended to be exhaustive or to limit the technology to the precise form disclosed. Many modifications and variations are possible in light of the above teaching. The described embodiments were chosen in order to best explain the principles of the technology and its practical application to thereby enable others skilled in the art to best utilize the technology in various embodiments and with various modifications as are suited to the particular use contemplated. It is intended that the scope of the technology be defined by the claims appended hereto.

We claim:

1. A semiconductor device, comprising:
   a substrate comprising a dielectric core between first and second conductive layers, the substrate further having first and second opposed surfaces, the substrate comprising:
   solder balls on the first surface of the substrate, the solder balls being in direct contact with one of the first and second conductive layers of the substrate and configured to couple the semiconductor device to a host device, and corner structural supports in direct contact with the substrate at corners of the substrate, the corner structural supports having a higher strength than the solder balls; and one or more semiconductor dies coupled to the second surface of the substrate.

2. The semiconductor device of claim 1, wherein the corner structural supports comprise structural billets.

3. The semiconductor device of claim 1, wherein the corner structural supports comprise copper billets.

4. The semiconductor device of claim 1, wherein the structural supports comprise a single structural billet in each of four corners of the substrate.

5. The semiconductor device of claim 1, wherein the structural supports comprise a plurality of structural billets in each of four corners of the substrate.

6. The semiconductor device of claim 1, wherein the structural supports comprise structural billets which are not part of a conductive pattern for transmitting signals to and from the one or more semiconductor dies.

7. A semiconductor device, comprising:
a substrate comprising:
a dielectric core;
a first conductive layer on a first side of the dielectric core;
a second conductive layer on a second side of the dielectric core;
one or more vias electrically coupling portions of the first conductive layer with portions of the second conductive layer;
first and second opposed surfaces;
solder balls on the first surface and configured to couple the semiconductor device to a host device, and
one or more structural billets, instead of solder balls, on the first surface at each of the corners of the substrate, the one or more structural billets having a higher strength than the solder balls; and
one or more semiconductor dies separate from and coupled to the second surface of the substrate, the substrate configured to transfer signals between the one or more semiconductor dies and the host device.

8. The semiconductor device of claim 7, wherein the one or more structural billets are formed on a side of the substrate opposite the one or more semiconductor dies.

9. The semiconductor device of claim 7, wherein the one or more structural billets are formed of copper.

10. The semiconductor device of claim 7, wherein the one or more structural billets have a circular cross-section.

11. The semiconductor device of claim 7, wherein the one or more structural billets have one of a rectangular cross-section and an "L"-shaped cross-section.

12. The semiconductor device of claim 7, wherein the one or more structural billets are not part of a conductive pattern for transmitting signals to and from the one or more semiconductor dies.

13. The semiconductor device of claim 7, wherein the one or more structural billets are part of a conductive pattern for transmitting signals to and from the one or more semiconductor dies.

14. A semiconductor device, comprising:
a substrate, the substrate comprising:
a dielectric core;
a first conductive layer on a first side of the dielectric core;
a second conductive layer on a second side of the dielectric core;
one or more vias electrically coupling portions of the first conductive layer with portions of the second conductive layer;
first and second opposed surfaces;
solder balls on the first surface of the substrate, the solder balls being in direct contact with the substrate and configured to couple the semiconductor device to a host device, and
structural support means on the first surface of the substrate for structurally supporting the semiconductor device on the host device, the structural support means in direct contact with the substrate and provided at corners of the substrate and having a higher strength than the solder balls; and
one or more semiconductor dies coupled to the second surface of the substrate.

* * * * *